(12) United States Patent
Surganov

(10) Patent No.: US 9,146,044 B2
(45) Date of Patent: Sep. 29, 2015

(54) SOLAR PANEL SYSTEM AND METHODS OF PASSIVE TRACKING

(76) Inventor: Anthony Surganov, Chicago, IL (US)

( * ) Notice: Subject to any disclaimer, the term of this patent is extended or adjusted under 35 U.S.C. 154(b) by 512 days.

(21) Appl. No.: 13/467,985

(22) Filed: May 9, 2012

(65) Prior Publication Data

US 2012/0285509 A1 Nov. 15, 2012

Related U.S. Application Data

(60) Provisional application No. 61/483,933, filed on May 9, 2011.

(51) Int. Cl.
*H01L 31/042* (2014.01)
*F24J 2/54* (2006.01)
*F24J 2/38* (2014.01)
*H01L 31/054* (2014.01)
*F24J 2/52* (2006.01)

(52) U.S. Cl.
CPC *F24J 2/5431* (2013.01); *F24J 2/38* (2013.01); *H01L 31/0547* (2014.12); *H02S 20/00* (2013.01); *F24J 2/523* (2013.01); *F24J 2/541* (2013.01); *F24J 2002/5441* (2013.01); *F24J 2002/5489* (2013.01); *Y02E 10/47* (2013.01); *Y02E 10/52* (2013.01)

(58) Field of Classification Search
USPC .................................................. 136/246, 248
See application file for complete search history.

(56) References Cited

U.S. PATENT DOCUMENTS

| | | | |
|---|---|---|---|
| 4,159,710 A | 7/1979 | Prast | |
| 4,198,954 A | 4/1980 | Meijer | |
| 4,256,175 A | 3/1981 | Strickland | |
| 4,295,621 A * | 10/1981 | Siryj | 248/183.2 |
| 4,328,789 A | 5/1982 | Nelson | |
| 4,396,006 A | 8/1983 | Cross, Jr. | |
| 4,476,854 A * | 10/1984 | Baer | 126/579 |
| 4,765,309 A | 8/1988 | Legge | |
| 7,795,568 B2 * | 9/2010 | Sherman | 250/203.4 |
| 2010/0095955 A1 | 4/2010 | Carrasco Martinez | |
| 2011/0048406 A1 * | 3/2011 | Hoffman | 126/600 |

* cited by examiner

*Primary Examiner* — Jeffrey T Barton
*Assistant Examiner* — Uyen Tran
(74) *Attorney, Agent, or Firm* — Valauskas Corder LLC

(57) ABSTRACT

A solar tracking system and methods based on passive tracking of solar illumination impinging on solar panels. The system includes a solar panel having cardinal points of the panel provided with piston assemblies. Actuating of pistons in the piston assemblies orients the solar panel to maximize solar illumination impinging on the solar panel. A conduit facilitates flow of a fluid between a solar illumination sensor and piston assembly based on changes in temperature of a canister and fluid contained within the canister. The heating of the fluid causes the fluid to flow toward and activate the piston assembly to rotate the solar panel about a longitudinal axis or lateral axis, which passively orients the solar panel in a position to maximize solar illumination impinging on a front face of the solar panel.

13 Claims, 4 Drawing Sheets

SOLAR PANEL SYSTEM AND METHODS OF PASSIVE TRACKING

FIELD OF THE INVENTION

The invention relates generally to solar panels and more particularly to a system and methods for collecting solar energy using passive tracking. Specifically, the present invention contemplates a solar panel system and methods based on tracking techniques that facilitate bi-directional tracking of solar energy impinging on solar panels.

BACKGROUND OF THE INVENTION

Conventional solar panels using passive solar tracking systems employ a frame pivotable about an axis. The systems typically have two canisters at opposing ends that are connected to each other via a conduit. The canisters are filled with a volatile fluid that transfers between canisters based on the temperature in each of the canisters. More specifically, once solar energy heats one of the canisters at a temperature greater than the other canister, the volatile fluid will pass to the other canister and cause passive rotation of the solar panel.

U.S. Pat. No. 4,476,854 illustrates a passive solar tracking system as described above that has solar panels mounted on a pipe. The panels rotate about an axis defined by a rod. Canisters are positioned at opposing ends of a frame. A conduit connects the canisters to facilitate transfer of a volatile fluid between the canisters as the canisters are heated to different temperatures. The passive solar tracking system further includes a bracket that may be manually adjusted to improve solar input on the panels. However, since the bracket requires manual adjustment, such a tracking system does not provide bi-directional tracking of a solar panel or group of panels. Moreover, the design of the tracking system makes it vulnerable to wind damage since the pipe provides support for the frame and solar panels.

U.S. Pat. No. 4,198,954 provides an alternative solar tracking system that has a reflector pivotable about a horizontal axis. Tubular reservoirs are connected via a conduit and act as sun sensors. A rod and bellows moves a lever, which pivots the reflector upon heating of the tubular reservoirs. The reflector further includes tubular reservoirs that are connected via a conduit. The heating of the tubular reservoirs causes rotation of the reflector. More specifically, a rotary disc is positioned on the base plate. The rotary disc includes a gearwheel and transmission, which is connected to a lever, to rotate the reflector about a vertical axis. Certain disadvantages are associated with this conventional solar tracking system. Specifically, debris may accumulate between the rotary disc and base plate preventing rotation of the rotary disc.

An example of a bi-directional solar tracking is provided by U.S. Publication No. 2011/0048406. This solar tracking system has scissor shaped structures or lifters that facilitate pivoting of the solar panel about two perpendicular axes. Certain disadvantages are associated with this known solar tracking system. Specifically, the configuration of the lifters is complicated and susceptible to damage from twisting and torsional movement of the solar panel under wind conditions.

Therefore, a need exists for a solar tracking system and methods for passively collecting solar energy that is resistant to environmental factors such as wind, rain, and debris, and otherwise minimizes damage to the solar panel for bi-directional passive tracking. The present invention satisfies this demand.

SUMMARY OF THE INVENTION

Preferred embodiments of the present invention include a solar panel system and methods for providing passive solar tracking. Embodiments of the present invention permit bi-directional movement of the solar panel while providing an improved support mechanism to protect the solar panel such as from wind, rain, damage and debris.

In certain embodiments, the present invention includes a solar panel and a plurality of lift assemblies. The solar panel may be sized and shaped to have a longitudinal axis and a lateral axis. In certain embodiments, the longitudinal axis is aligned with east and west cardinal points, and a lateral axis is aligned with north and south cardinal points. In such embodiments, the lifting assemblies can cause the solar panel to rotate about one or both of the lateral and longitudinal axes.

Embodiments of the solar panel have a front face and a back face. In certain embodiments, the front face is positioned to receive solar illumination from the sun or another light source. In certain embodiments, the back face is connected to the plurality of lift assemblies. The solar panel may be oriented using a passive rotation arrangement to permit a maximum amount of solar illumination to impinge perpendicularly on the front face of the solar panel. Advantageously, the amount of solar energy collected in the solar panel may be improved as more rays of solar illumination impinge perpendicularly on a face of a solar panel, compared to when rays of solar illumination impinge non-perpendicularly.

Embodiments of the lift assemblies may include a piston that expands and contracts to raise and lower the solar panel at one of the cardinal points which rotates the solar panel about one of longitudinal and lateral axes. Accordingly, activation of more than one piston may rotate passively and bi-directionally the solar panel about the axes to maximize solar illumination that impinges perpendicularly to the front face of the solar panel. This solar energy captured by the solar panel is increased as compared to conventional passive solar tracking systems. Moreover, the connection of the piston assemblies to the four cardinal points at the back side of the solar panel improves structural support for the solar panel to protect against wind damage.

The lift assembly may include a ball and socket assembly connected to the piston that further supports rotational movement of the solar panel. As the piston extends and retracts linearly, the ball and socket assembly can pivot to accommodate the rotational motion of the solar panel about the longitudinal axis and/or the lateral axis.

In certain embodiments, a solar illumination sensor and conduit may also be included as part of the lift assemblies. The conduit connects the solar illumination sensor to the piston. Fluid is contained in the solar illumination sensor and conduit which may be heated to activate and extend the piston to rotate the solar panel about one of the axes. The solar illumination sensor may include a canister that receives solar illumination directly and/or indirectly from solar reflectors. The fluid in a heated canister may then be transferred to the piston to activate the piston. In this manner, separate solar illumination sensors may be connected to each of the pistons to facilitate passive rotation of the solar panel about the longitudinal axis and lateral axis to maximize solar illumination impinging perpendicular to the front face of the solar panel as the sun moves throughout the day.

In another embodiment of the invention, a method for passively tracking a solar panel in response to the sun's movement includes a step of providing a solar panel having pistons at each of the cardinal points to rotate the solar panel about a longitudinal axis and a lateral axis. The methods also may include a step of reflecting solar illumination toward one or more canisters to heat a fluid stored in the canister. Each canister is connected to a respective one of the pistons such that one canister may actuate a piston for each cardinal point of the solar panel. Additionally, the method activates each piston assembly upon the heating of the fluid to rotate passively the solar panel about at least one of the longitudinal axis and the lateral axis. Thus, embodiments of the method facilitate passive tracking of the sun to maximize solar illumination impinging perpendicular to the solar panel throughout the day.

The present invention and its attributes and advantages will be further understood and appreciated with reference to the detailed description below of presently contemplated embodiments, taken in conjunction with the accompanying drawings.

The described embodiments are to be considered in all respects only as illustrative and not restrictive, and the scope of the invention is not limited to the foregoing description. Those of skill in the art will recognize changes, substitutions and other modifications that will nonetheless come within the scope of the invention and range of the claims.

BRIEF DESCRIPTION OF THE DRAWINGS

The preferred embodiments of the invention will be described in conjunction with the appended drawings provided to illustrate and not to limit the invention, where like designations denote like elements, and in which.

DESCRIPTION OF PREFERRED EMBODIMENTS

Solar energy processes the sun's light or solar illumination to transform the solar illumination into electrical energy. Generally, a solar panel is formed by interconnecting a number of photovoltaic or solar cells. Solar illumination has photons that are absorbed by the solar cell to energize the cell. The energized solar cells then provide electricity, which may be used for residential or commercial use. Alternatively, the electricity may be stored until needed.

The performance of a solar panel is dependent on a number of factors, but especially on the angle of incidence between the solar illumination and the normal to a front face of the solar panel that receives solar illumination. Other external factors that affect the performance of a solar panel include of amount of rays received from the sun due to interference from clouds, fog, and rain. However, while weather may affect how often solar energy can be collected using a solar panel, many geographical areas have temperate climate zones that provide suitable environments for using solar panels.

Figure 1:
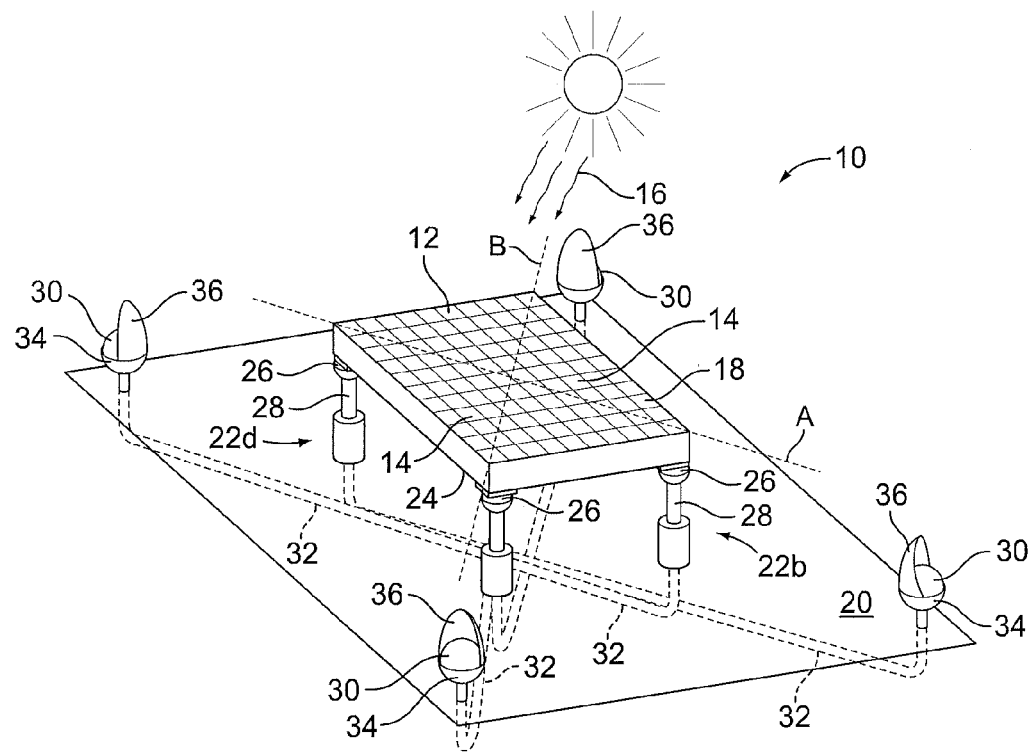
FIG. 1 is a perspective view of one embodiment of a solar panel system according to the invention.

A perspective view of a solar panel system, generally designated as 10, according to certain embodiments of the invention is shown in FIG. 1. The system 10 includes a solar panel 12 having multiple interconnected photovoltaic cells 14. The solar panel 12 is arranged to have a longitudinal axis A and a lateral axis B. Solar illumination 16 from the sun impinges on a front surface 18 of the solar panel 12 to energize the photovoltaic cells 14. The energized photovoltaic cells 14 convert the solar illumination 16 into electrical energy as is known to those skilled in the art of solar energy capture.

Figure 2:
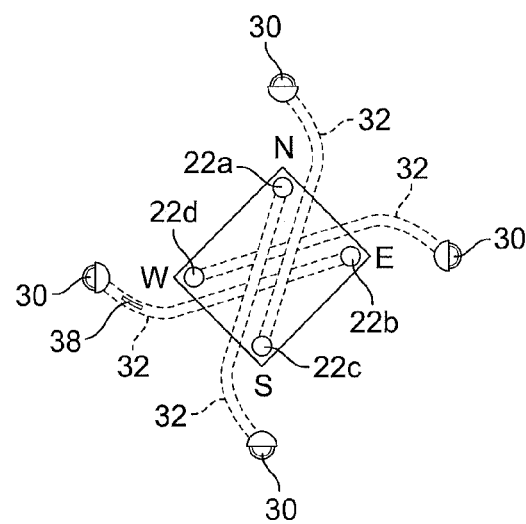
FIG. 2 is a top view of the solar panel system of FIG. 1 including the north and south lifting assemblies according to the invention.

The solar panel 12 is supported above a base surface 20, for example the ground, by a plurality of lifting mechanisms 22. In the illustrated embodiment, four lifting mechanisms 22a, 22b, 22c, 22d are provided at each of the cardinal points (i.e., north, south, east, and west, respectively) as best seen in FIG. 2. The lifting mechanisms 22a, 22b, 22c, 22d may attach to a back surface 24 of the solar panel 12.

Each of the lifting mechanisms 22a, 22b, 22c, 22d may include a ball and socket assembly 26, piston 28, and solar illumination sensor 30. A conduit 32 connects the solar illumination sensor 30 to the piston 28. The piston 28 is connected to the ball and socket assembly 26. The ball and socket assembly 26 is attached to the back surface 24 of the solar panel 12. The pistons 28 are configured to extend and retract to rotate the solar panel 12 about the longitudinal axis A and/or the lateral axis B.

Figure 3:
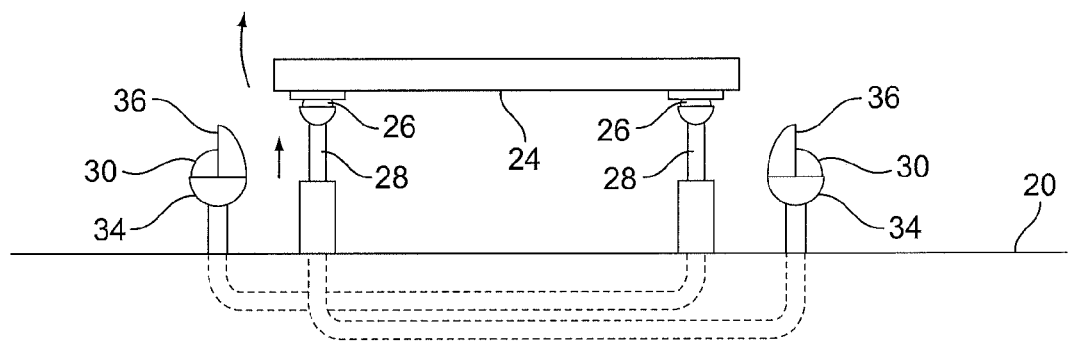
FIG. 3 is a side view of the solar panel system of FIG. 1 including the east and west lifting assemblies according to the invention.

The solar illumination sensors 30 are configured to receive the solar illumination 16. The sensors 30 each have a canister 34 and reflector 36, as best seen in FIG. 1 and FIG. 3. The reflectors 36 are arranged to direct the solar illumination 16 toward the canisters 34. Depending on the location of the sun, different solar illumination 16 impinges on each of the canisters 34 resulting in temperature differentials between each of the canisters 34. A fluid 38 is provided in each of the lifting mechanisms 22a, 22b, 22c, 22d and travels from the canisters 34 through the conduits 32 and toward the pistons 28 in response to the temperature of the canisters as they are heated to activate the pistons. In this manner, the changing temperature of the canisters 34 throughout the day changes the extensions of the pistons 28 and hence the position of the solar panel 12 Thus, a passive tracking system 10 is provided that maximizes solar illumination 16 impinging on the front face 18 of the solar panel 12.

Figure 4:
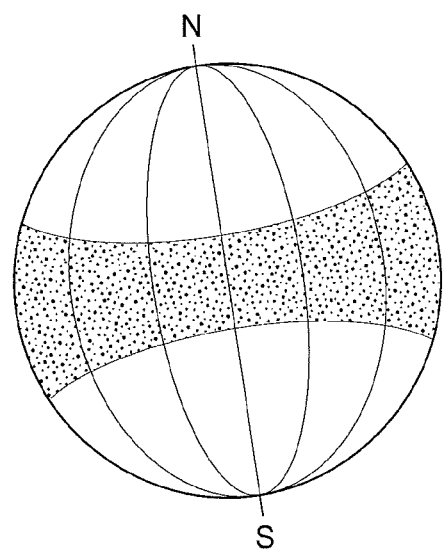
FIG. 4 is a diagram illustrating the position of the sun as it passes from east to west throughout a calendar year.

FIG. 4 is a diagram illustrating the position of the sun as it passes from east to west throughout a calendar year. As can be seen in the figure, the latitude of the sun varies throughout the year in the different hemispheres. Accordingly, it is contemplated that a length of a north piston 28 is greater than a length of a south piston 28 in the northern hemisphere. The reverse occurs for a solar panel system 10 designed for the southern hemisphere. Furthermore, the system 10 has an eastern piston 28 that is shorter than a western piston 28.

Figure 5:
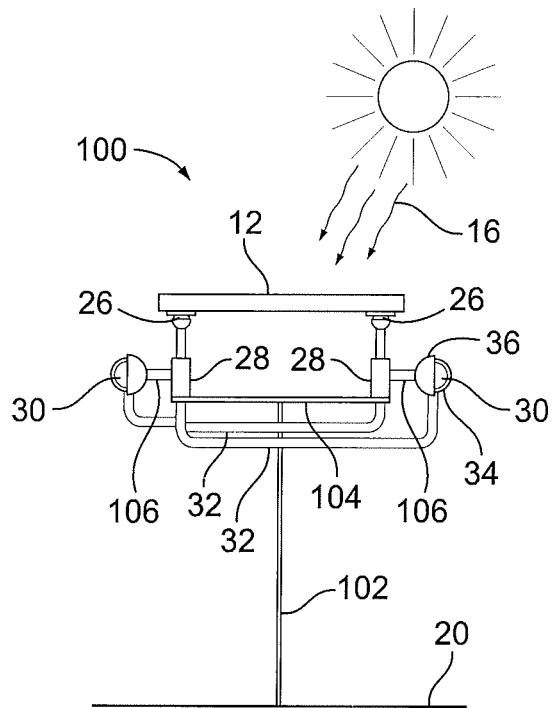
FIG. 5 is a side view of another embodiment of a solar panel system according to the invention.

FIG. 5 is a side view of solar panel system 100 according to another embodiment of the invention. In this embodiment, a pole 102 supports a base 104 that secures the pistons 28 and hence the solar panel 12. The solar illumination sensors 30 have arm portions 106 that extend from the pistons 28. The reflectors 36 of the solar illumination sensors 30 face away from the pistons 28 so that solar illumination is reflected toward the canisters 34. The conduit 32 attaches a canister 34 at one cardinal point (e.g., east) to a piston 28 at the opposing cardinal point (i.e., west).

Figure 6:
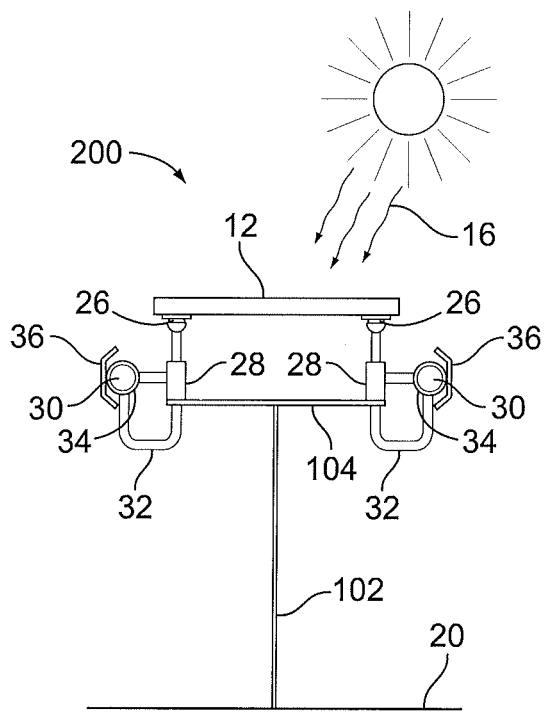
FIG. 6 is a side view of yet another embodiment of a solar panel system according to the invention.

FIG. 6 is a side view of a solar panel system 200 according to another embodiment of the invention. One difference between the embodiment of the solar panel system 200 and the system 100 of FIG. 5 is that the sensors 30 are connected to ends of the solar panel 12. Another difference is the solar reflectors 36 are reversed, so that solar illumination 16 is reflected toward the solar panel 12 instead of away from the solar panel. Similar to the system 100, the reflectors 36 reflect solar illumination 16 toward the canisters 34 to heat fluid in the canisters 34 and conduits 32. Another difference between the embodiment of the solar panel system 200 and the system 100 is the arrangement of the conduits 32. Solar panel system 200 has conduits 32 that secure to pistons 28 at the same cardinal point. Thus, a sensor 30 at the east cardinal point is connected via the conduit 32 to the piston 28 at the east cardinal point.

Figure 7A:
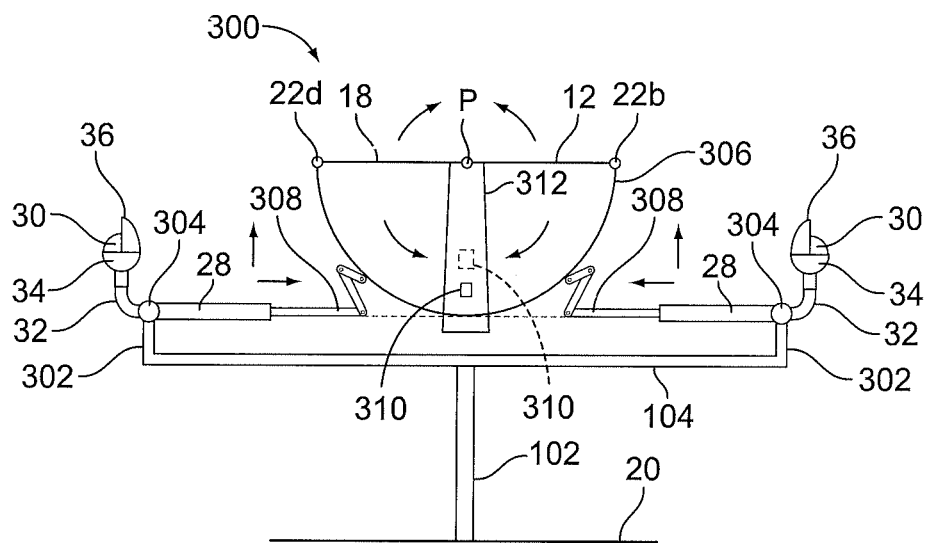
FIG. 7A is a perspective view of another embodiment of a solar panel system according to the invention.
Figure 7B:
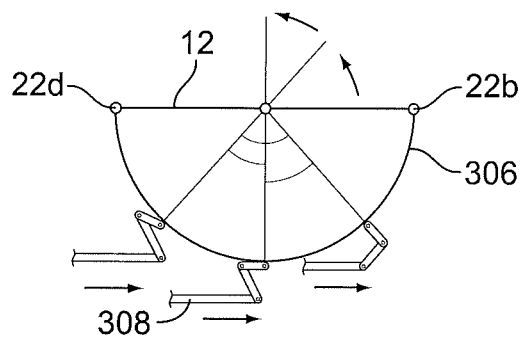
FIG. 7B is a detailed view of the solar panel system of FIG. 7A according to the invention.
Figure 8:
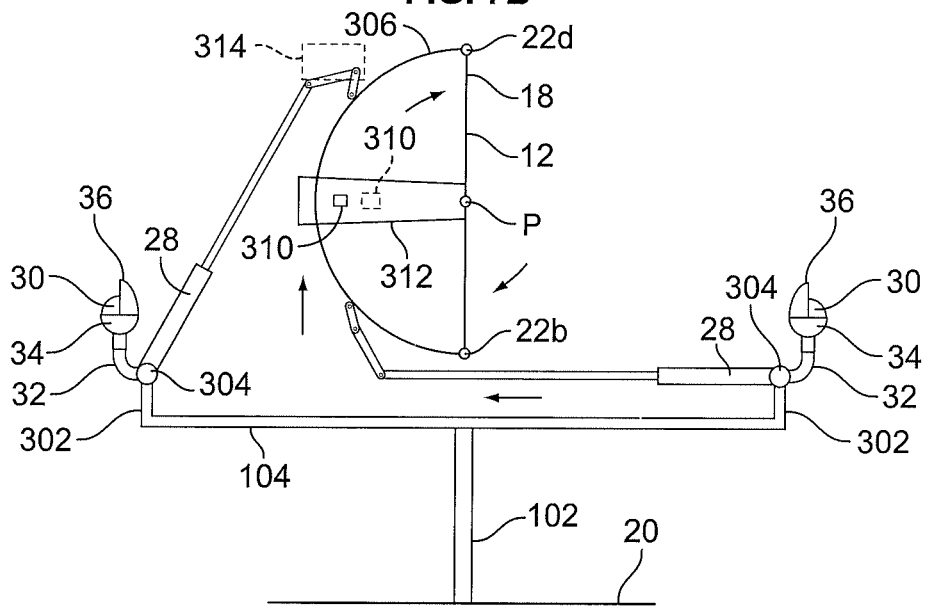
FIG. 8 is an alternative view of the solar panel system of FIG. 7A according to the invention.

In an alternative embodiment shown in FIG. 7A, FIG. 7B and FIG. 8, the solar panel system 300 includes a solar panel 12 of a spherical configuration 306 that is rotatable about pivot point "P" using a linkage system 312. The solar panel 12 includes a front surface 18 with photovoltaic cells 14 (see FIG. 1) that convert the solar illumination into electrical energy. In this embodiment, lifting mechanisms 22a, 22b, 22c, 22d may or may not be used along with the linkage system 312.

Linkage system 312 includes at least links 308, 310 attached to solar panel 12. More specifically, links 308, 310 each include piston 28 that facilitates links 308, 310 to extend and retract linearly as can be seen in FIG. 8.

As shown, a pole 102 extends from base surface 20 to base 104. More specifically, base 104 includes support stand element 302. Pivot element 304 connects support stand element 302 with links 308, 310 and solar illumination sensor 30. In particular, pivot element 304 connects to conduit 32 of the solar illumination sensor 30.

As described above, each sensor 30 includes a canister 34 and a reflector 36. Reflectors 36 are arranged to direct solar illumination toward the canisters 34. Depending on the location of the sun, different solar illumination impinges on each of the canisters 34 resulting in temperature differentials between each of the canisters 34. As an example, in response to an increase in temperature of the canisters 34, pistons 28 are activated to extend and thereby rotate the solar panel 12 about pivot point "P" as shown in FIG. 8.

One advantage of the invention is that the solar energy captured by a solar panel is maximized by using a passive tracking system that does not require an external energy source to move the solar panel in response to movement of the sun throughout the day. Another advantage of the invention is that movement of the solar panel is bi-directional such that longitudinal and latitude changes in the location of the sun each day may be accounted for without any external user adjustments to the solar panel. Furthermore, the solar panel system may use multiple pistons to facilitate rotation of the solar panel. Each of the pistons additionally assists with maintaining the solar panel in position to prevent excessive movement of and damage to the solar panel due to excess wind, rain, debris or other environmental factors.

While this disclosure is susceptible to various modifications and alternative forms, specific exemplary embodiments thereof have been shown by way of example in the drawings and have herein been described in detail. It should be understood, however, that there is no intent to limit the disclosure to the particular embodiments disclosed, but on the contrary, the intention is to cover all modifications, equivalents, and alternatives falling within the scope of the disclosure as defined by the appended claims.

What is claimed is:

1. A solar panel system, comprising:
a solar panel having a longitudinal axis configured to be aligned with an east cardinal point and a west cardinal point, and a lateral axis configured to be aligned with a north cardinal point and a south cardinal point;
said solar panel having a front face and a back face, said front face configured to receive solar illumination; and
a plurality of lift assemblies connected to said back face of said solar panel at each of the cardinal points,
wherein each of said lift assemblies further comprises:
a ball and socket assembly connected to said back side of said solar panel;
a piston connected to said ball and socket assembly, said piston configured to extend and retract to rotate said solar panel about one of the longitudinal axis and the lateral axis;
a solar illumination sensor configured to receive solar illumination;
and a conduit connecting said solar illumination sensor to said piston to facilitate passive rotation of said solar panel about the longitudinal axis and the lateral axis to maximize solar illumination impinging on said front face of said solar panel,
wherein said solar illumination sensor includes a reflector and a canister, said canister is connected to said conduit, and wherein a fluid is provided in said canister and said conduit to activate said piston when said solar illumination heats said canister.

2. The solar panel system according to claim 1, wherein said piston is a hydraulic piston.

3. The solar panel system according to claim 1, wherein said piston at the west cardinal point is longer than said piston at the east cardinal point.

4. The solar panel system according to claim 1, wherein said piston at the north cardinal point is longer than said piston at the south cardinal point.

5. The solar panel system according to claim 1, wherein said piston at the south cardinal point is longer than said piston at the north cardinal point.

6. A method for passively tracking a solar panel in response to the sun's movement, comprising the steps of:
providing a solar panel having four lifting mechanisms at opposing cardinal points of the solar panel to rotate the solar panel about a longitudinal axis defined by an east cardinal point and a west cardinal point and a lateral axis defined by a north cardinal point and a south cardinal point, each lifting mechanism including a conduit connecting a sensor and a piston, each sensor comprising a canister filled with a fluid;
reflecting solar illumination toward one or more sensors to heat the fluid stored in the canister to obtain heated fluid, the conduit conveying the heated fluid from the sensor to the piston; and
activating each piston to rotate passively the solar panel about at least one of the longitudinal axis and the lateral axis.

7. The solar panel system according to claim 1 further comprising a base supporting said piston.

8. The solar panel system according to claim 7 further comprising a pole supporting said base.

9. The solar panel system according to claim 1, wherein said solar illumination sensor faces toward said piston.

10. The solar panel system according to claim 1, wherein said conduit connects said solar illumination sensor positioned at a first cardinal point to said piston positioned at a second cardinal point, the first cardinal point the same as the second cardinal point.

11. The solar panel system according to claim 1, wherein said solar illumination sensor faces away said piston.

12. The solar panel system according to claim 1, wherein said conduit connects said solar illumination sensor positioned at a first cardinal point to said piston positioned at a second cardinal point, the first cardinal point opposing the second cardinal point.

13. The method for passively tracking a solar panel in response to the sun's movement according to claim 6, wherein the four lifting mechanisms are each positioned at a corner of the solar panel.

* * * * *